United States Patent
Sun et al.

(10) Patent No.: US 9,865,314 B2
(45) Date of Patent: Jan. 9, 2018

(54) OPERATION INSTRUCTION GENERATING CIRCUIT AND CONSUMABLE CHIP

(71) Applicant: APEX MICROELECTRONICS CO., LTD., Guangdong (CN)

(72) Inventors: Wanli Sun, Guangdong (CN);
Xiongwei Wang, Guangdong (CN);
Ruyan Xue, Guangdong (CN); Huiling Yang, Guangdong (CN)

(73) Assignee: APEX MICROELECTRONICS CO., LTD., Guangdong (CN)

( * ) Notice: Subject to any disclaimer, the term of this patent is extended or adjusted under 35 U.S.C. 154(b) by 0 days.

(21) Appl. No.: 15/528,925

(22) PCT Filed: Nov. 25, 2015

(86) PCT No.: PCT/CN2015/095537
§ 371 (c)(1),
(2) Date: May 23, 2017

(87) PCT Pub. No.: WO2016/082761
PCT Pub. Date: Jun. 2, 2016

(65) Prior Publication Data
US 2017/0330604 A1    Nov. 16, 2017

(30) Foreign Application Priority Data

Nov. 28, 2014 (CN) .......................... 2014 1 0715520
Jun. 10, 2015 (CN) .......................... 2015 1 0317365

(51) Int. Cl.
*G11C 7/10*        (2006.01)
*B41J 2/175*       (2006.01)
*G11C 7/20*        (2006.01)

(52) U.S. Cl.
CPC ........... *G11C 7/109* (2013.01); *B41J 2/17546* (2013.01); *G11C 7/20* (2013.01)

(58) Field of Classification Search
CPC ....... G11C 7/109; G11C 7/20; G11C 13/0002; G11C 13/0004; G11C 13/0023;
(Continued)

(56) References Cited

U.S. PATENT DOCUMENTS 7,321,436 B2 * 1/2008 Asauchi ............... B41J 2/17546
                                                             358/1.15
2008/0106757 A1   5/2008 Asauchi
2017/0069357 A1   3/2017 Sun

FOREIGN PATENT DOCUMENTS

CN    1530233 A    9/2004
CN    1749980 A    3/2006
(Continued)

OTHER PUBLICATIONS

International Search Report issued in PCT/CN2015/095537 dated Feb. 23, 2016, 3 pages.
(Continued)

*Primary Examiner* — Richard Elms
*Assistant Examiner* — Ajay Ojha
(74) *Attorney, Agent, or Firm* — RatnerPrestia (57) ABSTRACT

An operation instruction generating circuit and a consumable chip. The operation instruction generating circuit includes: a power-on initialization module, connected to a signal wire and used for generating an initialization signal according to a signal transmitted by the signal wire; a middle signal generating module, connected to the power-on initialization module and the signal wire and used for combining, according to the initialization signal, the signal transmitted by the signal wire to generate a middle signal; and an instruction generating module, connected to the power-on initialization module and the middle signal generating module and used for generating an operation instruction according to the initialization signal and the middle signal or according to the initialization signal, the middle signal, and
(Continued)

the signal transmitted by the signal wire. By the operation instruction generating circuit, the consumable chip is enabled to accurately respond to actions of a printing imaging device in time.

20 Claims, 5 Drawing Sheets

(58) Field of Classification Search
CPC ....... G11C 13/0069; G11C 16/10; G11C 7/00; B41J 2/17546; H03M 11/24
See application file for complete search history.

(56) References Cited

FOREIGN PATENT DOCUMENTS

| | | |
|---|---|---|
| CN | 104943395 A | 9/2015 |
| WO | 2010027470 A2 | 3/2010 |

OTHER PUBLICATIONS

PCT Written Opinion of the International Searching Authority issued in PCT/CN2015/095537 dated Feb. 23, 2016, 4 pages.

* cited by examiner

OPERATION INSTRUCTION GENERATING CIRCUIT AND CONSUMABLE CHIP

CROSS REFERENCE OF RELATED APPLICATION

The present disclosure is the U.S. National Phase Application of International Application No. PCT/CN2015/095537, titled "OPERATION INSTRUCTION GENERATING CIRCUIT AND CONSUMABLE CHIP", filed on Nov. 25, 2015, which claims the priority to Chinese Patent Application No. CN201410715520.0, titled "SIGNAL SOURCE IDENTIFICATION CIRCUIT AND CONSUMABLE CHIP INCLUDING THE SAME", filed on Nov. 28, 2014 and Chinese Patent Application No. CN201510317365.1, titled "OPERATION INSTRUCTION GENERATION CIRCUIT AND CONSUMABLE CHIP", filed on Jun. 10, 2015. All of the aforementioned patent applications are incorporated herein by reference in their entirety.

FIELD

The present disclosure relates to the technical field of print imaging, and in particular to an operation instruction generating circuit and a consumable chip.

BACKGROUND

Devices for print imaging have been diversified, and presently print imaging devices widely used mainly include: inkjet printers, laser printers, LED printers, stylus printers and thermal printers. During a printing process, a print imaging device consumes coloring materials, such as ink and toner, and the coloring materials are generally placed in a consumable cartridge so as to be supplemented and replaced conveniently.

In order to record information such as a source and usage of the consumable cartridge, a consumable chip which can electrically record the information is provided on the consumable cartridge. In this way, in a case that the coloring materials in the consumable cartridge are consumed up, a user can supplement the coloring materials by replacing the box consumables. The print imaging device electrically reads information stored on the consumable chip, thereby updating a state of the print imaging device timely and automatically without manually inputting information by the user, such as a type and a production date of the consumable cartridge.

Figure 1:
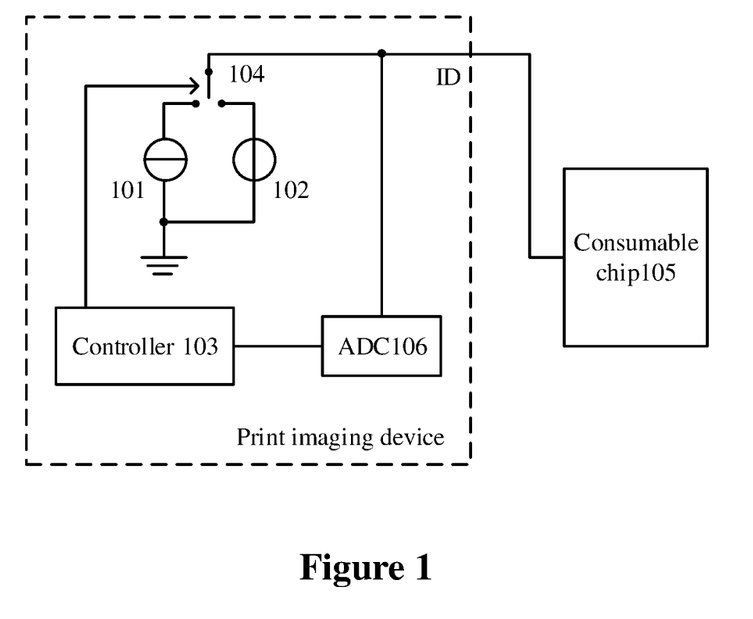
FIG. 1 is a schematic diagram showing a connection relationship between a print imaging device and a consumable chip in conventional technology.

Some conventional print imaging devices read information stored on the consumable chip or write information into the consumable chip by way of a connection shown in FIG. 1. As shown in FIG. 1, a current source 101 and a voltage source 102 are provided in the print imaging device. An output voltage of the voltage source 102 is 16V, and a drive current of the voltage source 102 is greater than 10 mA. A drive current of the current source 101 is 1 mA, and an amplitude of a highest voltage of the current source 101 is 15V. Under the control of a controller 103, a toggle switch 104 may switch between outputting a current source signal and outputting a voltage source signal to a signal line ID.

The signal line ID is connected to a consumable chip 105. When performing a reading operation, the print imaging device outputs a current source signal to the signal line ID and detects a voltage of the signal line ID with an ADC 106, thereby reading data stored in the consumable chip. When performing a writing operation, the print imaging device outputs a voltage source signal to the signal line ID, thereby writing data to be written into the consumable chip.

In practice, the issue that how to accurately determine, by the consumable chip, whether the print imaging device needs to perform a reading operation or a writing operation based on the signal transmitted through the signal line ID is not addressed well, thereby resulting in error responses of the consumable chip.

SUMMARY

In order to address the above issue, an operation instruction generating circuit is provided according to the present disclosure, which includes:

a powering up and initializing module, connected to a signal line and configured to generate an initialized signal based on a signal transmitted through the signal line;

an intermediate signal generating module, connected to the powering up and initializing module and the signal line and configured to generate an intermediate signal based on the initialized signal in combination with the signal transmitted through the signal line; and an instruction generating module, connected to the powering up and initializing module and the intermediate signal generating module and configured to generate an operation instruction based on the initialized signal and the intermediate signal or based on the initialized signal, the intermediate signal and the signal transmitted through the signal line.

According to an embodiment of the present disclosure, the intermediate signal is a high level signal or a low level signal, in a case that the signal transmitted through the signal line is a current source signal; or the intermediate signal is a low level signal or a high level signal, in a case that the signal transmitted through the signal line is a voltage source signal.

According to an embodiment of the present disclosure, the powering up and initializing module includes a first phase inverter and a first energy storage unit, where an input terminal of the first phase inverter is connected to the signal line via a resistor, and the first energy storage unit is connected between the input terminal and a ground terminal of the first phase inverter.

According to an embodiment of the present disclosure, the first energy storage unit includes a capacitor or a transistor.

According to an embodiment of the present disclosure, the intermediate signal generating module includes a first signal generating unit, a latch and a second phase inverter, where the latch is connected to the first signal generating unit and the powering up and initializing module, and the second phase inverter is connected to the latch.

According to an embodiment of the present disclosure, the first signal generating unit includes:

a first switch, a control terminal of which is connected to the signal line via a first resistor and a first outreach terminal of which is connected to the signal line via a second resistor; and a second switch, a control terminal of which is connected to an output terminal of the intermediate signal generating module, a first outreach terminal of which is connected to the control terminal of the first switch via a third resistor and a second outreach terminal of which is connected to a second outreach terminal of the first switch, where a second energy storage unit is connected between the control terminal and the second outreach terminal of the first switch, and a third energy storage unit is connected between the first outreach terminal and the second outreach terminal of the first switch.

According to an embodiment of the present disclosure, a voltage of the third resistor is lower than a starting voltage of the first switch, in a case that the signal transmitted through the signal line is a current source signal; or the voltage of the third resistor is higher than or equal to the starting voltage of the first switch, in a case that the signal transmitted through the signal line is a voltage source signal.

According to an embodiment of the present disclosure, the instruction generating module includes:

a first AND gate, a first input terminal of which is connected to the signal line and a second input terminal of which is connected to the intermediate signal generating module; and/or a first NOR gate and a second AND gate, where a first input terminal and a second input terminal of the first NOR gate are connected to the powering up and initializing module and the intermediate signal generating module, respectively, and a first input terminal and a second input terminal of the second AND gate are connected to the signal line and the first NOR gate, respectively.

A consumable chip is further provided according to the present disclosure, which includes:

the operation instruction generating circuit according to any of the descriptions above; and a data storage circuit, configured to store or output data in response to an operation instruction outputted by the operation instruction generating circuit.

The operation instruction generating circuit according to the present disclosure can accurately determine an intention of a print imaging device based on a type of a signal transmitted through a signal line ID. That is, the operation instruction generating circuit can accurately generate a reading instruction in a case that the signal transmitted through the signal line ID is a current source signal; and the operation instruction generating circuit can accurately generate a writing instruction in a case that the signal transmitted through the signal line ID is a voltage source signal, thereby facilitating timely and accurate responding of the consumable chip to an action of the print imaging device.

A non-volatile memory which can be rewritten easily (for example, a flash memory) does not directly apply to a print imaging device which is accessed via a voltage source and a current source, while the operation instruction generating circuit according to the present disclosure can generate a corresponding operation instructions (for example, a reading instruction or a writing instruction) based on a voltage signal or a current source signal, so that the non-volatile memory which can be rewritten easily can be installed and used in the print imaging device.

Other features and advantages of the present disclosure will be described in the specification hereinafter, which become obvious from the specification partly or are known through implementation of the present disclosure. Objects and other advantages of the present disclosure can be achieved and obtained by structures particularly described in the specification, claims and drawings.

BRIEF DESCRIPTION OF THE DRAWINGS

The drawings show various embodiments according to various aspects of the present disclosure, and are used to explain principles of the present disclosure together with the specification. Those skilled in the art should understand that the specific embodiments shown by the drawings are only illustrative and are not intended to limit the scope of the present disclosure. It should be appreciated that in some examples, one element shown may be designed as multiple elements, or multiple elements shown may be designed as one element. In some examples, an element shown as an internal part of another element may be implemented as an external part of the another element, and vice versa. In order to describe the illustrative embodiments of the present disclosure more clearly and in more detail for those skilled in the art to thoroughly understand all aspects and featured advantages of the present disclosure, the drawings are introduced. In the drawings.

DETAILED DESCRIPTION OF THE EMBODIMENTS

Implementation of the invention is described in detail in conjunction with the drawings and embodiments hereinafter, with which a processing of how to address the technical issue by technical means and achieve technical effects in the present disclosure can be fully understood and implemented accordingly. It should be noted that the embodiments of the present disclosure and the features in the embodiments may be combined with each other as long as they do not conflict with each other and that technical solutions generated through the combination fall within the scope of the present disclosure.

In addition, many specific details are described for purposes of explanation in the following descriptions, so that the embodiments of the present disclosure can be understood thoroughly. However, it is apparent to those skilled in the art that the present disclosure may be implemented not by the specific details or in the specific ways described here.

Figure 2:
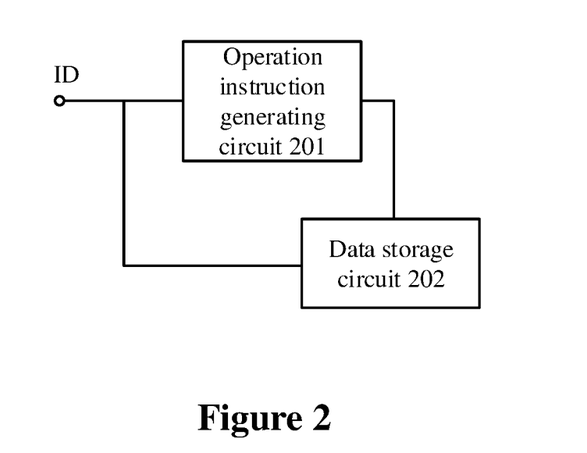
FIG. 2 is a schematic structural diagram of a consumable chip according to an embodiment of the present disclosure.

A new consumable chip is provided according to the present disclosure, and the consumable chip applies to a print imaging device which accesses data in a consumable chip via a voltage source and a current source. FIG. 2 shows a schematic structural diagram of a consumable chip according to an embodiment.

As shown in FIG. 2, the consumable chip according to the embodiment includes an operation instruction generating circuit 201 and a data storage circuit 202. Specifically, the operation instruction generating circuit 201 is configured to identify whether a signal transmitted through a signal line ID is a voltage source signal or a current source signal, i.e., whether the signal line ID is connected to a voltage source or a current source in the print imaging device. In a case that a voltage source signal is transmitted through the signal line ID, the operation instruction generating circuit 201 outputs a writing instruction WR. In a case that a current source signal is transmitted through the signal line ID, the operation instruction generating circuit 201 outputs a reading instruction RD.

In the embodiment, the operation instruction generation circuit 201 includes one input terminal for receiving the signal transmitted in the ID signal line and two output terminals. The two output terminals are respectively a reading instruction output terminal RD and a writing instruction output terminal WR, and hence, the operation instruction generating circuit is also referred to as a RD/WR identification circuit in the embodiment.

The data storage circuit 202 is connected to the reading instruction output terminal RD and the writing instruction output terminal WR of the operation instruction generating circuit 201. In the data storage circuit 202, a memory which is easily programmed and erased (for example, an EEPROM, a ferroelectric memory, a phase change memory or a flash memory) or a combination of a volatile memory and a power supply (for example, an SRAM with a battery) may function as a storage unit. The data storage circuit 202 performs a data reading or a data writing operation on a target address of the data storage circuit 202 in response to the reading instruction or writing instruction received according to address information received (a transmission path of the address information is not show in FIG. 2).

In the embodiment, information stored in the data storage circuit 202 includes: identification information of a consumable cartridge, a manufacturer, a production date, ink usage, ink residual and toner colors. Practically, in other embodiments of the invention, the information stored in the data storage circuit 202 may include only some of the information listed above or include other reasonable information not listed above, which is not limited in the present disclosure.

A high level or a low level is outputted by the reading instruction output terminal RD and the writing instruction output terminal WR. In the embodiment, a corresponding signal is defined as an active signal in a case that a high level is output. In a case that the reading instruction output terminal RD outputs a high level, it is indicated that the reading instruction is active. In a case that the writing instruction output terminal WR outputs a high level, it is indicated that the writing instruction is active.

As the operation instruction generating circuit 201 outputs only two kinds of active signals, i.e., either the reading instruction is active or the writing instruction is active, in other embodiments of the invention, the two output terminals may be integrated into one output terminal within the operation instruction generating circuit 201. For example, in a case that the output terminal outputs a high level, it is defined that the writing instruction is active; or in a case that the output terminal outputs a low level, it is defined that the reading instruction is active. In this way, accordingly, the data storage circuit 202 only needs one input port to receive the reading instruction and the writing instruction, and it is not necessary to provide two ports to receive the reading instruction and the writing instruction respectively. In this way, not only is a circuit structure of the data storage circuit simplified, but also a process of analyzing and processing the reading instruction and the writing instruction by the data storage circuit is simplified, thereby improving reading/writing efficiency for data.

In a case that the operation instruction generating circuit 201 outputs a high level at the reading instruction output terminal RD, it is indicated that the print imaging device needs to read data stored in the consumable chip. The print imaging device reads the data by collecting a voltage of the ID signal line. In this case, the data storage circuit 202 in the consumable chip outputs data at a target address in the data storage circuit 202 to the signal line ID based on the address information received, for the print imaging device to read information stored at a corresponding address in the consumable chip by collecting data transmitted through the signal line ID.

Figure 3:
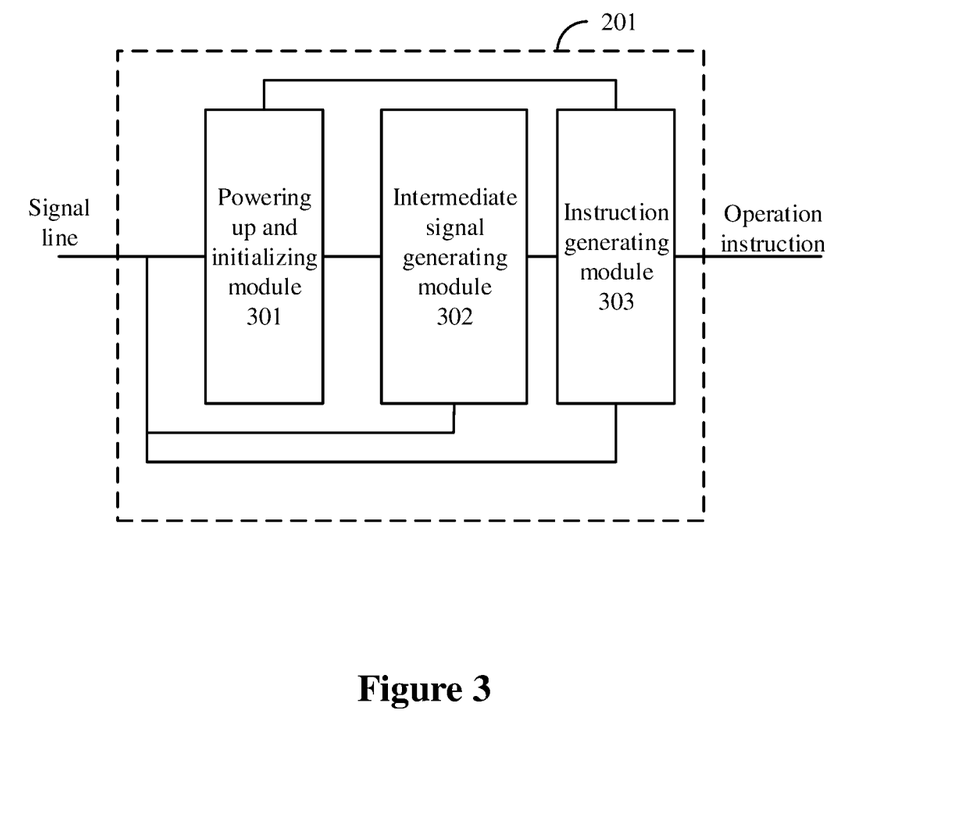
FIG. 3 is a schematic structural diagram of an operation instruction generating circuit according to an embodiment of the present disclosure.

As described above, the consumable chip according to the embodiment determines an intention of the print imaging device based on the signal outputted via the signal line ID. In a case that the signal transmitted through the signal line ID is a current source signal, the consumable chip determines that the print imaging device is to perform a reading operation. In a case that the signal transmitted through the signal line ID is a voltage source signal, the consumable chip determines that the print imaging device is to perform a writing operation (for example, a programming operation). For this purpose, an operation instruction generating circuit shown in FIG. 3 is provided according to the embodiment.

The operation instruction generating circuit 201 according to the embodiment includes two main parts and a related peripheral circuit. One main part is a powering up and initializing module 301, and the other main part is a circuit composed of an intermediate signal generating module 302 and an instruction generating module 303.

The powering up and initializing module 301 is connected to a signal line ID, and can generate an initialized signal based on a signal transmitted through the signal line and transmit the initialized signal to the intermediate signal generating module 302 and the instruction generating module 303. The intermediate signal generating module 302 is connected to the powering up and initializing module and the signal line ID, and can generate an intermediate signal based on the initialized signal and the signal transmitted through the signal line ID. The instruction generating module 303 is connected to the powering up and initializing module 301, the intermediate signal generating module 302 and the signal line ID, and generates an operation instruction based on the initialized signal, the intermediate signal and the signal transmitted through the signal line ID. In the embodiment, the operation instruction generated by the operation instruction generating circuit 201 includes a reading instruction and a writing instruction.

Figure 4:
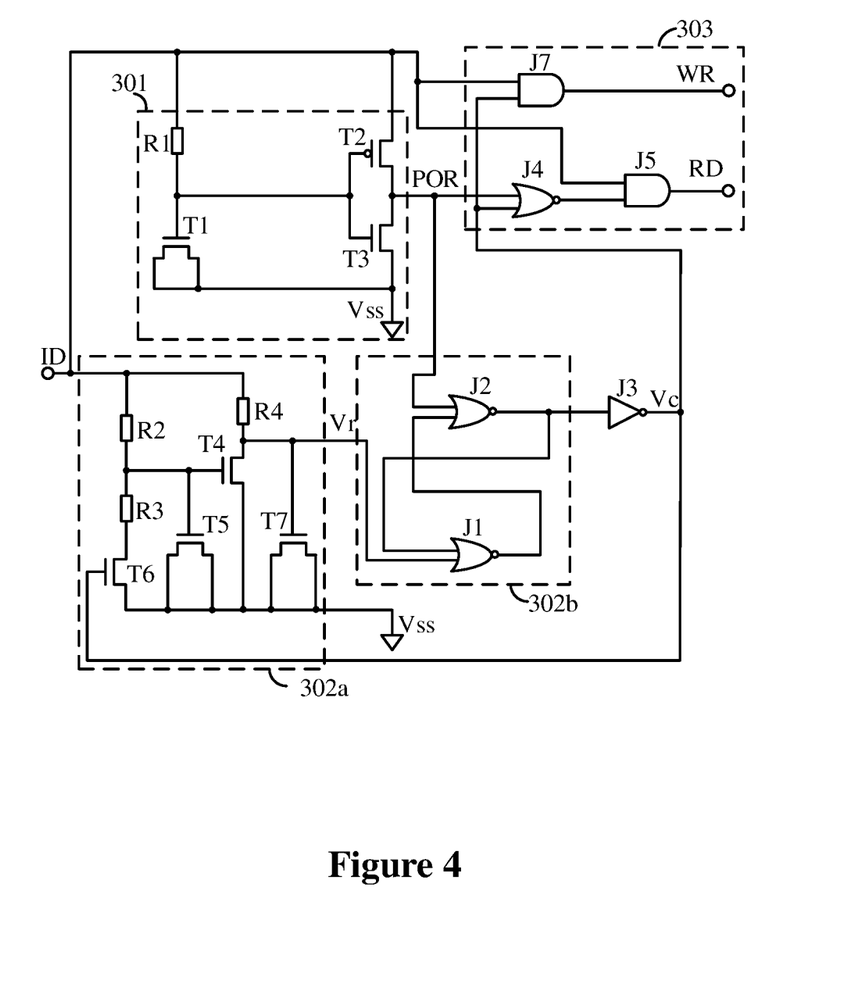
FIG. 4 is a schematic diagram of an operation instruction generating circuit according to an embodiment of the present disclosure.

FIG. 4 shows a specific schematic circuit diagram of the operation instruction generating circuit according to the embodiment.

As shown in FIG. 4, in the embodiment, the powering up and initializing module 301 includes a resistor R1, a transistor T1 functioning as a first energy storage unit, and a first phase inverter composed of a transistor T2 and a transistor T3. The powering up and initializing module 301 can generate the initialized signal based on the signal transmitted through the signal line.

It should be noted that in other embodiments of the invention, the first energy storage unit and/or the first phase inverter may be implemented by other appropriate components or circuits, which is not limited in the present disclosure. For example, in an embodiment of the invention, the first energy storage unit may be a capacitor.

The intermediate signal generating module 302 includes a first signal generating unit 302a, a latch 302b and a second phase inverter J3. An input terminal of the latch 302b is connected to the first signal generating unit 302a and the powering up and initializing module 301, an input terminal of the second phase inverter J3 is connected to an output terminal of the latch 302b, and an output terminal of the second phase inverter J3 is connected to the instruction generating module 303 and the first signal generating unit 302a.

Specifically, as shown in FIG. 4, the first signal generating unit 302a includes a first resistor R2 and a third resistor R3 connected in series, a phase inverter composed of a first switch T4 and a second resistor R4, a second switch T6 for providing feedback, a transistor T5 functioning as a second energy storage unit and a transistor T7 functioning as a third energy storage unit. The first signal generating unit 302a outputs a first signal Vr.

In the embodiment, the first switch T4 and the second switch T6 each are implemented by a transistor. Practically, in other embodiments of the invention, the first switch, the second switch, the second energy storage unit and/or the third energy storage unit may be implemented by other appropriate components or circuits, which is not limited in the present disclosure.

A control terminal (i.e., a grid) of the first switch (i.e., the transistor T4) is connected to the signal line ID via a first resistor R2, a first outreach terminal (i.e., a source) of the first switch is connected to the signal line ID via a second resistor R4, and a second outreach terminal (i.e., a drain) of the first switch is connected to the ground Vss. A control terminal (i.e., a grid) of the second switch (i.e., the transistor T6) is connected to the output terminal of the intermediate signal generating module, a first outreach terminal (i.e., a source) of the second switch is connected to the control terminal of the first switch via the third resistor R3, and a second outreach terminal (i.e., a drain) of the second switch is connected to the ground Vss.

The second energy storage unit is connected between the control terminal and the second outreach terminal of the first switch T4, and the third energy storage unit is connected between the first outreach terminal and the second outreach terminal of the first switch T4. Specifically, in the embodiment, a grid of the transistor T5 functioning as the second energy storage unit is connected to the control terminal of the first switch T4, and a source and a drain of the transistor T5 are both connected to the ground Vss. A grid of the transistor T7 functioning as the third energy storage unit is connected to the first outreach terminal of the first switch T4, and a source and a drain of the transistor T7 are both connected to the ground Vss.

It should be noted that in other embodiments of the invention, the energy storage units may be other appropriate circuits or components (for example, capacitors) in replacement of the transistor T5 and/or the transistor T7, which is not limited in the present disclosure.

In the embodiment, the instruction generating module 303 includes a first AND gate J7, a first NOR gate J4 and a second AND gate J5. A first input terminal of the first AND gate J7 is connected to the signal line ID, and a second input terminal of the first AND gate J7 is connected to an output terminal of the second phase inverter J3. A first input terminal and a second input terminal of the first NOR gate J4 are connected to the powering up and initializing module 301 and the output terminal of the second phase inverter J3 respectively, and a first input terminal and a second input terminal of the second AND gate J5 are connected to the signal line ID and the output terminal of the first NOR gate J4 respectively.

An initialized signal POR and the first signal Vr are outputted to an SR latch composed of the NOR gate J1 and the NOR gate J2. An output of the latch is inverted by the second phase inverter (i.e., the NOT gate J3) and then the second phase inverter outputs an intermediate signal Vc. The intermediate signal Vc is transmitted to the grid of the transistor T6. In addition, the intermediate signal Vc and the initialized signal POR are outputted to two input terminals of the first NOR gate J4 respectively. Two input terminals of the second AND gate J5 respectively receive an output of the first NOR gate J4 and the signal transmitted through the signal line ID, and an output terminal RD of the second AND gate J5 outputs a reading instruction. On the other hand, two input terminals of the first AND gate J7 respectively receive the signal transmitted through the signal line ID and the intermediate signal Vc, and an output terminal WR of the first AND gate J7 outputs a writing instruction.

The resistor R3 should meet the following conditions: a voltage distributed to the resistor R3 by a current source does not reach a starting voltage of the transistor T4, in a case that the signal transmitted through the signal line ID is a current source signal and the transistor T6 is switched on; and a voltage distributed to the resistor R3 by a voltage source reaches or exceeds a starting voltage of the transistor T5, in a case that the signal transmitted through the signal line ID is a voltage source signal and the transistor T6 is switched on.

The operation instruction generating circuit performs powering up and initializing, as soon as the signal transmitted through the signal line ID is transmitted to the operation instruction generating circuit. Specifically, when the signal transmitted through the signal line ID is just transmitted to the operation instruction generating circuit, the signal transmitted through the signal line ID will charge the transistor T5 since the transistor T5 functions as a capacitor. In this case, the grid of the transistor T4 is at a low level, and the transistor T4 is thus not switched on. Similarly, since the transistor T7 as well functions as a capacitor, in this case the first signal Vr outputted by the first signal generating unit 302a is a low level signal.

Similarly, as soon as the signal in the signal line ID is transmitted to the operation instruction generating circuit, the signal transmitted through the signal line ID charges the transistor T1 functioning as a capacitor via the resistor R1, thereby ensuring that a signal received by the inverter composed of the transistor T2 and the transistor T3 at the beginning is a low level signal. In this way, the inverter outputs a high level initialized signal POR.

Since the first signal Vr is a low level signal and the initialized signal POR is a high level signal, the SR latch composed of the NOR gate J1 and the NOR gate J2 initially outputs a low level signal to the NOT gate J3 so that the intermediate signal Vc is a high level signal in an initial phase.

In a case that the transistor T1 functioning as a capacitor is charged well enough to start the transistor T3, the initialized signal POR discharges via the transistor T3 and is restored to a low level. Since the intermediate signal Vc is a high level signal, the transistor T6 is to be switched on.

The operation instruction generating circuit 201 is configured to identify whether the signal transmitted through the signal line ID is a voltage source signal or a current source signal, i.e., whether the signal line ID is connected to a voltage source or a current source in the print imaging device. In a case that the signal transmitted through the signal line ID is a voltage source signal, the operation instruction generating circuit 201 outputs a writing instruction WR. In a case that the signal transmitted through the signal line ID is a current source signal, the operation instruction generating circuit 201 outputs a reading instruction RD.

In order to clarify the objects, principles and advantages of the present disclosure more clearly, a process of how the operation instruction generating circuit 201 generates the writing instruction WR based on a voltage source signal or generates the reading instruction based on a current source signal is further described.

In the embodiment, with a drive current of the current source assumed to be 1 mA, an amplitude of a highest voltage of the current source assumed to be 15V and the starting voltage of the transistor T4 assumed to be 1.5V, a resistance of the resistor R3 should be smaller than 1.5 kΩ in a case that the signal transmitted through the signal line ID is a current source signal.

After the initialization is completed, the transistor T6 is switched on. Since the resistance of the resistor R3 is smaller than 1.5 kΩ and a current flowing through the resistor R3 is 1 mA, a voltage distributed to the resistor R3 (lower than 1.5V) is not sufficient to start the transistor T4. At this time, charging of the transistor T7 functioning as a capacitor is completed, and thus the first signal Vr will be a high level signal.

Besides, as the initialized signal POR has returned to a low level, an output signal of the latch 302b changes to a high level signal and the intermediate signal Vc outputted by the output terminal of the phase inverter J3 is a low level signal. Since the initialized signal POR and the intermediate signal VC are both low level signals, the signal outputted by the NOR gate J4 is a high level signal. It is easy to learn that the reading instruction output terminal RD outputs a high level and the writing instruction output terminal WR outputs a low level in this case, which indicates that the reading instruction is active.

In the embodiment, with an output voltage of the voltage source assumed to be 16V, a drive current of the voltage source assumed to be greater than 10 mA and the starting voltage of the transistor T4 assumed to be 1.5V, a ratio of a resistance of R3 to that of R2 should ensure that a voltage distributed to the resistor R3 is higher than 1.5V (for example, the resistance of R3 is 1 kΩ and the resistance of R2 is 3 kΩ) in a case that the signal transmitted through the signal line ID is a voltage source signal.

After the initialization is completed, the transistor T6 is switched on, the voltage distributed to the resistor R3 is 4V which is higher than the starting voltage of the transistor T4, and hence the transistor T4 is switched on. In a case that the transistor T4 is switched on, the transistor T7 functioning as a capacitor discharges via the transistor T4, thereby restoring the first signal Vr to a low level.

In this case, the initialized signal POR and the first signal Vr are both low level signals. Hence, the intermediate signal Vc maintains at a high level, and the NOR gate J4 outputs a low level signal. It is easy to learn that the reading instruction output terminal RD outputs a low level signal and the writing instruction output terminal WR outputs a high level signal, which indicates that the writing instruction is active.

Practically, in other embodiments of the invention, in a case that the signal transmitted through the signal line ID is a current source signal, a high level intermediate signal Vc may be outputted; or in a case that the signal transmitted through the signal line ID is a voltage source signal, a low level intermediate signal Vc may be outputted, which is not limited in the present disclosure. In this case, the instruction generating circuit outputs a high level signal at the reading instruction output terminal RD and outputs a low level signal at the writing instruction output terminal WR based on the high level intermediate signal Vc.

As the operation instruction generating circuit 201 only two kinds of active signals, i.e., either the reading instruction is active or the writing instruction is active, in other embodiments of the invention, the two output terminals may be integrated into one output terminal within the operation instruction generating circuit 201, thereby simplifying the operation instruction generating circuit and reducing a volume and a cost of the circuit.

Figure 5:
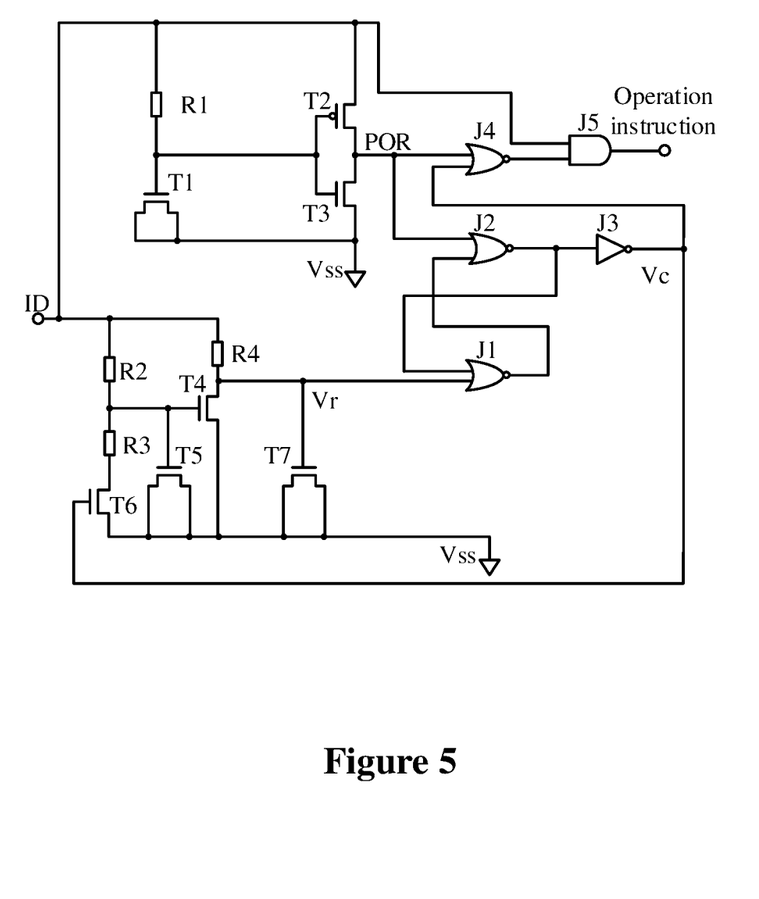
FIG. 5 is a schematic diagram of an operation instruction generating circuit according to an embodiment of the present disclosure.
Figure 6:
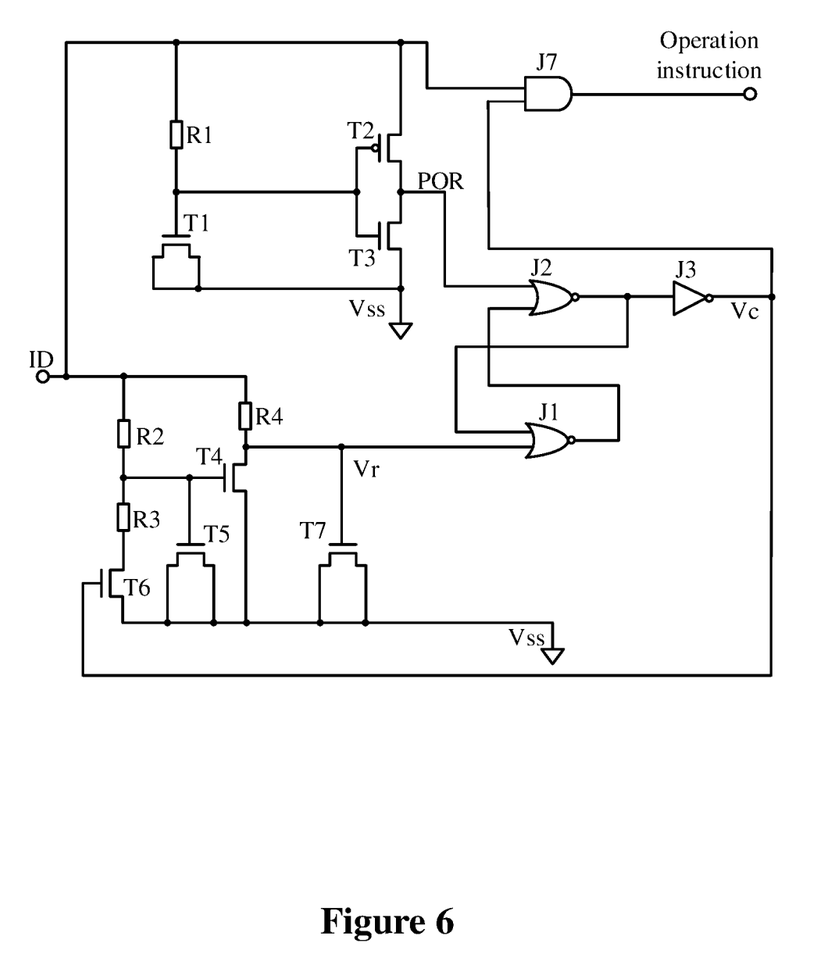
FIG. 6 is a schematic diagram of an operation instruction generating circuit according to an embodiment of the present disclosure.

For example, in an embodiment of the invention, the operation instruction generating circuit may have the circuit structure shown in FIG. 5. A high level signal outputted by the circuit indicates a reading instruction, and a low level signal outputted by the circuit indicates a writing instruction. In another embodiment of the invention, the operation instruction generating circuit may have the circuit structure show in FIG. 6. A high level signal outputted by the circuit indicates a writing instruction, and a low level signal outputted by the circuit indicates a reading instruction.

According to the descriptions above, the operation instruction generating circuit according to the embodiment can accurately determine an intention of the print imaging device based on a type of the signal transmitted through the signal line ID. That is, the operation instruction generating circuit can accurately generate a reading instruction in a case that the signal transmitted through the signal line ID is a current source signal; or the operating instruction generating circuit can accurately generate a writing instruction in a case that the signal transmitted through the signal line ID is a voltage source signal, thereby facilitating the consumable chip to respond to an action of the print imaging device timely and accurately.

Besides, a non-volatile memory which can be rewritten easily (for example, a flash memory) does not directly apply to a print imaging device which is accessed via a voltage source and a current source, while the operation instruction generating circuit according to the embodiment can generate a corresponding operation instruction (for example, a reading instruction or a writing instruction) based on a voltage source signal or a current source signal so that the non-volatile memory which can be rewritten easily can be installed and used in the print imaging device.

It should be understood that the embodiments according to the present disclosure are not limited to specific structures, processing steps or material disclosed herein, but should include equivalent substitutions of these features as understood by those skilled in the art. It should also be understood that the terms applied herein are only used for a purpose of describing the specific embodiments rather than a purpose of limitation.

"An embodiment" or "embodiment" mentioned in the description is intended to mean that specific features, structures or properties described in conjunction with the embodiment are included in at least one embodiment of the present disclosure. Hence, phrases "an embodiment" or "embodiment" used throughout the description may not necessarily refer to the same embodiment.

For convenience, multiple items, structural modules and/or component modules used herein may appear in a common list. As should be understood, each element in the list is identified as a single unique member. Hence, in a case of no counter description, no member in the list can be interpreted as an actual equivalent of any other member in the list just because they appear in the common list. In addition, reference may be made to the embodiments and examples in the present disclosure together with substitutions of the elements. It should be understood that the embodiments, examples and substitutions are not interpreted as equivalents of each other but should be considered as independent representations of the present disclosure.

Although the above embodiments are used to illustrate principles of the present disclosure in one or more applications, apparently, those skilled in the art can make various changes to the forms, usage and implementation details of the embodiments without any creative work without deviating from the principles and concepts of the present disclosure. Hence, the present disclosure is defined by the appended claims.

The invention claimed is:

1. An operation instruction generating circuit, comprising:
   a powering up and initializing module, connected to a signal line and configured to generate an initialized signal based on a signal transmitted through the signal line;
   an intermediate signal generating module, connected to the powering up and initializing module and the signal line and configured to generate an intermediate signal based on the initialized signal in combination with the signal transmitted through the signal line; and
   an instruction generating module, connected to the powering up and initializing module and the intermediate signal generating module and configured to generate an operation instruction based on the initialized signal and the intermediate signal or based on the initialized signal, the intermediate signal and the signal transmitted through the signal line.

2. The circuit according to claim 1, wherein,
   the intermediate signal is a high level signal or a low level signal, in a case that the signal transmitted through the signal line is a current source signal; or
   the intermediate signal is a low level signal or a high level signal, in a case that the signal transmitted through the signal line is a voltage source signal.

3. The circuit according to claim 1, wherein the powering up and initializing module comprises a first phase inverter and a first energy storage unit, an input terminal of the first phase inverter is connected to the signal line via a resistor, and the first energy storage unit is connected between the input terminal and a ground terminal of the first phase inverter.

4. The circuit according to claim 3, wherein the first energy storage unit comprises a capacitor or a transistor.

5. The circuit according to claim 1, wherein the intermediate signal generating module comprises a first signal generating unit, a latch and a second phase inverter, the latch is connected to the first signal generating unit and the powering up and initializing module, and the second phase inverter is connected to the latch.

6. The circuit according to claim 2, wherein the intermediate signal generating module comprises a first signal generating unit, a latch and a second phase inverter, the latch is connected to the first signal generating unit and the powering up and initializing module, and the second phase inverter is connected to the latch.

7. The circuit according to claim 3, wherein the intermediate signal generating module comprises a first signal generating unit, a latch and a second phase inverter, the latch is connected to the first signal generating unit and the powering up and initializing module, and the second phase inverter is connected to the latch.

8. The circuit according to claim 5, wherein the first signal generating unit comprises:
   a first switch, a control terminal of which is connected to the signal line via a first resistor and a first outreach terminal of which is connected to the signal line via a second resistor; and
   a second switch, a control terminal of which is connected to an output terminal of the intermediate signal generating module, a first outreach terminal of which is connected to the control terminal of the first switch via a third resistor and a second outreach terminal of which is connected to a second outreach terminal of the first switch,
   wherein a second energy storage unit is connected between the control terminal and the second outreach terminal of the first switch, and a third energy storage unit is connected between the first outreach terminal and the second outreach terminal of the first switch.

9. The circuit according to claim 8, wherein,
   a voltage of the third resistor is lower than a starting voltage of the first switch, in a case that the signal transmitted through the signal line is a current source signal; or
   the voltage of the third resistor is higher than or equal to the starting voltage of the first switch, in a case that the signal transmitted through the signal line is a voltage source signal.

10. The circuit according to claim 1, wherein the instruction generating module comprises:
    a first AND gate, a first input terminal of which is connected to the signal line and a second input terminal of which is connected to the intermediate signal generating module; and/or
    a first NOR gate and a second AND gate, wherein a first input terminal and a second input terminal of the first NOR gate are connected to the powering up and initializing module and the intermediate signal generating module respectively, and a first input terminal and a second input terminal of the second AND gate are connected to the signal line and the first NOR gate respectively.

11. The circuit according to claim 2, wherein the instruction generating module comprises:
    a first AND gate, a first input terminal of which is connected to the signal line and a second input terminal of which is connected to the intermediate signal generating module; and/or
    a first NOR gate and a second AND gate, wherein a first input terminal and a second input terminal of the first NOR gate are connected to the powering up and initializing module and the intermediate signal generating module respectively, and a first input terminal and a second input terminal of the second AND gate are connected to the signal line and the first NOR gate respectively.

12. The circuit according to claim 3, wherein the instruction generating module comprises:
    a first AND gate, a first input terminal of which is connected to the signal line and a second input terminal of which is connected to the intermediate signal generating module; and/or
    a first NOR gate and a second AND gate, wherein a first input terminal and a second input terminal of the first NOR gate are connected to the powering up and initializing module and the intermediate signal generating module respectively, and a first input terminal and a second input terminal of the second AND gate are connected to the signal line and the first NOR gate respectively.

13. A consumable chip, comprising:
an operation instruction generating circuit; and
a data storage circuit, configured to store data or output data in response to an operation instruction outputted by the operation instruction generating circuit,
wherein the operation instruction generating circuit comprises:
a powering up and initializing module, connected to a signal line and configured to generate an initialized signal based on a signal transmitted through the signal line;
an intermediate signal generating module, connected to the powering up and initializing module and the signal line and configured to generate an intermediate signal based on the initialized signal in combination with the signal transmitted through the signal line; and
an instruction generating module, connected to the powering up and initializing module and the intermediate signal generating module and configured to generate an operation instruction based on the initialized signal and the intermediate signal or based on the initialized signal, the intermediate signal and the signal transmitted through the signal line.

14. The consumable chip according to claim 13, wherein the intermediate signal is a high level signal or a low level signal, in a case that the signal transmitted through the signal line is a current source signal; or
the intermediate signal is a low level signal or a high level signal, in a case that the signal transmitted through the signal line is a voltage source signal.

15. The consumable chip according to claim 13, wherein the powering up and initializing module comprises a first phase inverter and a first energy storage unit, an input terminal of the first phase inverter is connected to the signal line via a resistor, and the first energy storage unit is connected between the input terminal and a ground terminal of the first phase inverter.

16. The consumable chip according to claim 15, wherein the first energy storage unit comprises a capacitor or a transistor.

17. The consumable chip according to claim 13, wherein the intermediate signal generating module comprises a first signal generating unit, a latch and a second phase inverter, the latch is connected to the first signal generating unit and the powering up and initializing module, and the second phase inverter is connected to the latch.

18. The consumable chip according to claim 17, wherein the first signal generating unit comprises:
a first switch, a control terminal of which is connected to the signal line via a first resistor and a first outreach terminal of which is connected to the signal line via a second resistor; and
a second switch, a control terminal of which is connected to an output terminal of the intermediate signal generating module, a first outreach terminal of which is connected to the control terminal of the first switch via a third resistor, and a second outreach terminal of which is connected to a second outreach terminal of the first switch,
wherein a second energy storage unit is connected between the control terminal and the second outreach terminal of the first switch, and a third energy storage unit is connected between the first outreach terminal and the second outreach terminal of the first switch.

19. The consumable chip according to claim 18, wherein
a voltage of the third resistor is lower than a starting voltage of the first switch, in a case that the signal transmitted through the signal line is a current source signal; or
the voltage of the third resistor is higher than or equal to the starting voltage of the first switch, in a case that the signal transmitted through the signal line is a voltage source signal.

20. The consumable chip according to claim 13, wherein the instruction generating module comprises:
a first AND gate, a first input terminal of which is connected to the signal line and a second input terminal of which is connected to the intermediate signal generating module; and/or
a first NOR gate and a second AND gate, wherein a first input terminal and a second input terminal of the first NOR gate are connected to the powering up and initializing module and the intermediate signal generating module respectively, and a first input terminal and a second input terminal of the second AND gate are connected to the signal line and the first NOR gate respectively.

* * * * *